United States Patent [19]
Kaneko

[11] Patent Number: 6,056,124
[45] Date of Patent: May 2, 2000

[54] CARRIER TAPE

[76] Inventor: Toshiko Kaneko, 10-6, Osada, Nishikawa-cho, Toyoake-shi, Aichi-ken, Japan

[21] Appl. No.: 09/232,855

[22] Filed: Jan. 19, 1999

[51] Int. Cl.$^7$ .................................................. B65D 73/02
[52] U.S. Cl. .......................... 206/714; 206/561; 206/725
[58] Field of Search .................................. 206/560, 714, 206/716, 722, 724, 725, 561

[56] References Cited

U.S. PATENT DOCUMENTS

| | | | |
|---|---|---|---|
| 5,333,733 | 8/1994 | Murata | 206/714 |
| 5,375,710 | 12/1994 | Hayakawa et al. | 206/724 |
| 5,690,233 | 11/1997 | Kaneko | 206/724 |
| 5,878,890 | 3/1999 | Kaneko | 206/725 |

*Primary Examiner*—David T. Fidei
*Attorney, Agent, or Firm*—Dennison, Scheiner, Schultz & Wakeman

[57] ABSTRACT

A carrier tape in which bottomed accommodating recesses whose upper surfaces are opened are provided in a row, comprises opening-closing spring pieces provided in each of the accommodating recesses, the opening-closing spring pieces being disposed on an upper surface of a product accommodated in each of the accommodating recesses and being capable of opening and closing from a closing position for preventing the product from dropping out upward to an opening position for allowing the product to be taken out upward. With this structure, it is possible to excellently prevent the product from dropping out.

1 Claim, 4 Drawing Sheets

CARRIER TAPE

BACKGROUND OF THE INVENTION

1. Field of the Invention

The present invention relates to an improvement of a carrier tape.

2. Description of the Prior Art

A conventional carrier tape is designed such the carrier tape is provided with accommodating recesses formed in a row so that a product such as an electronic part can be accommodated in each of the accommodating recesses. However, in the case of the conventional carrier tape, a drop out-preventing projection projecting inward is integrally formed on an upper surface side of the accommodating recess so as to prevent the product from dropping out from the accommodating recess. Since the drop out-preventing projection is integrally formed with the carrier tape, there is a problem that the molding die is complicated.

SUMMARY OF THE INVENTION

The present invention has been accomplished in view of the problem of the conventional carrier tape, and an object of the invention is to provide a carrier tape capable of excellently preventing the product from dropping out from the accommodating recess. A first aspect is that the carrier tape in which bottomed accommodating recesses whose upper surfaces are opened are provided in a row, comprises opening-closing spring pieces provided in each of the accommodating recesses, the opening-closing spring pieces being disposed on an upper surface of a product accommodated in each of the accommodating recesses and being capable of opening and closing from a closing position for preventing the product from dropping out upward to an opening position for allowing the product to be taken out upward.

A second aspect is that each of the opening-closing spring pieces is separately formed into a plate-like shape, and opposite ends thereof are fitted to fitting grooves formed in wall surfaces of each of the accommodating recesses.

DETAILED DESCRIPTION OF THE INVENTION

An embodiment of the present invention will be hereinafter explained with reference to the drawings.

Figure 1:
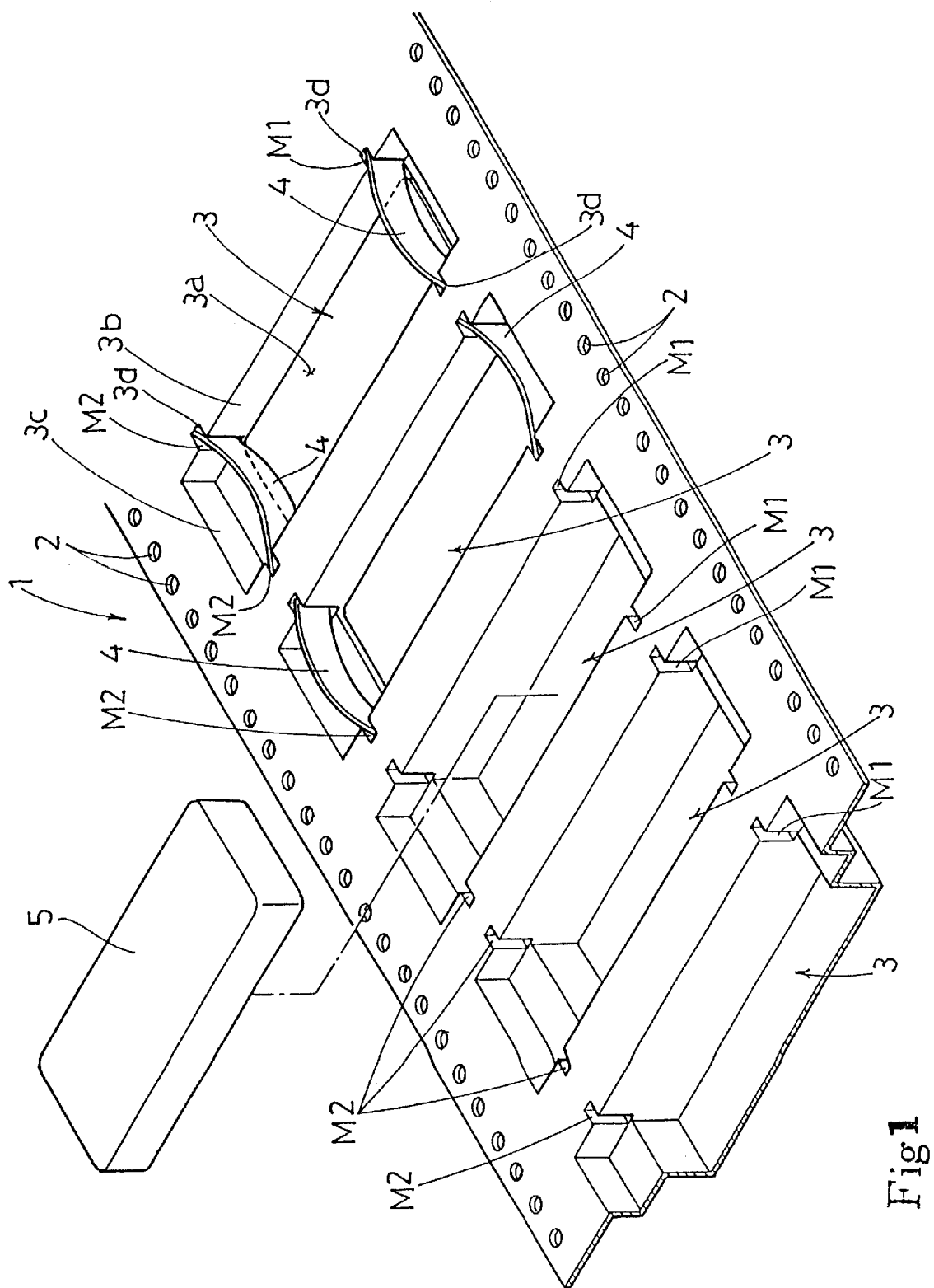
FIG. 1 is an enlarged perspective view of a carrier tape.
Figure 2:
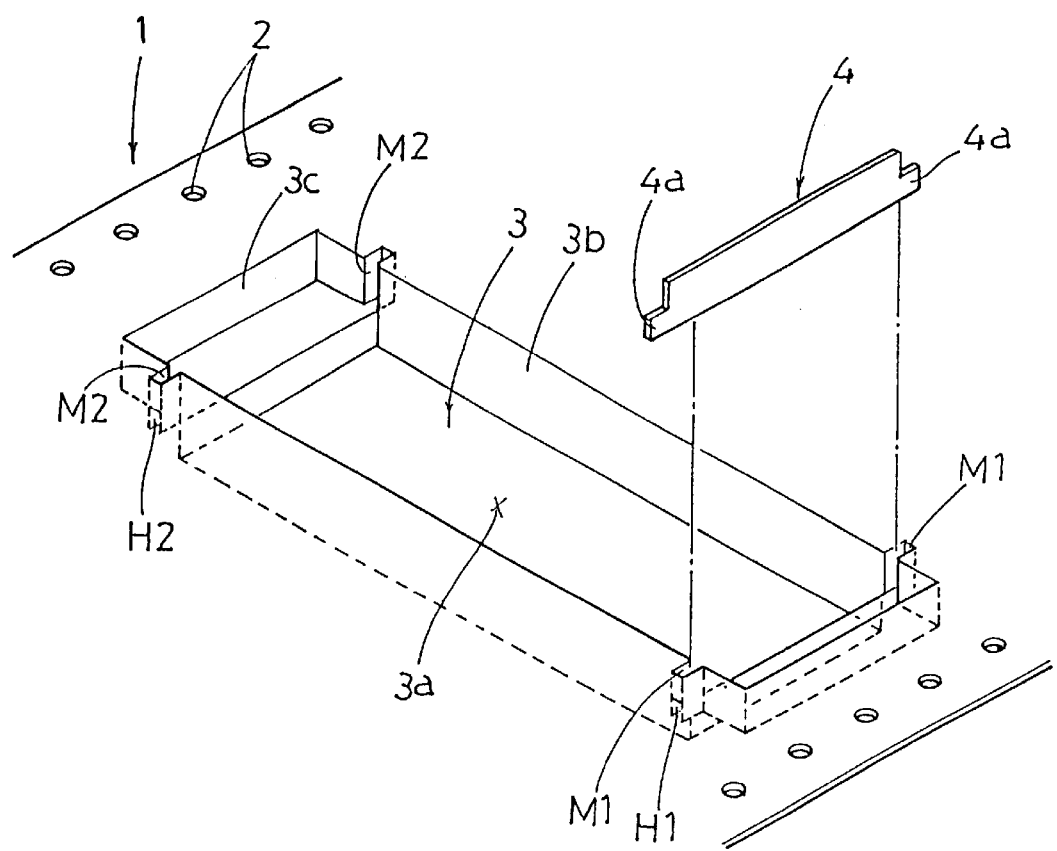
FIG. 2 is an enlarged perspective view of an accommodating recess in FIG. 1.
Figure 3:
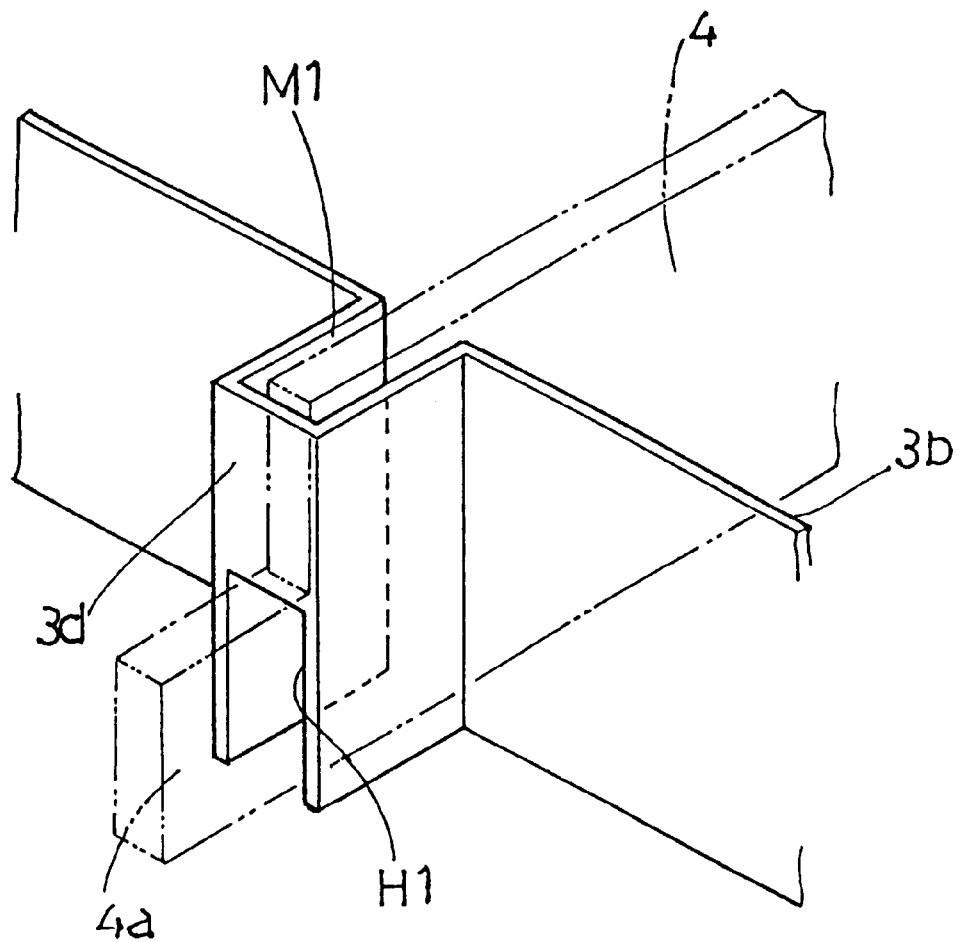
FIG. 3 is an enlarged perspective view of an essential portion in FIG. 2.
Figure 4:
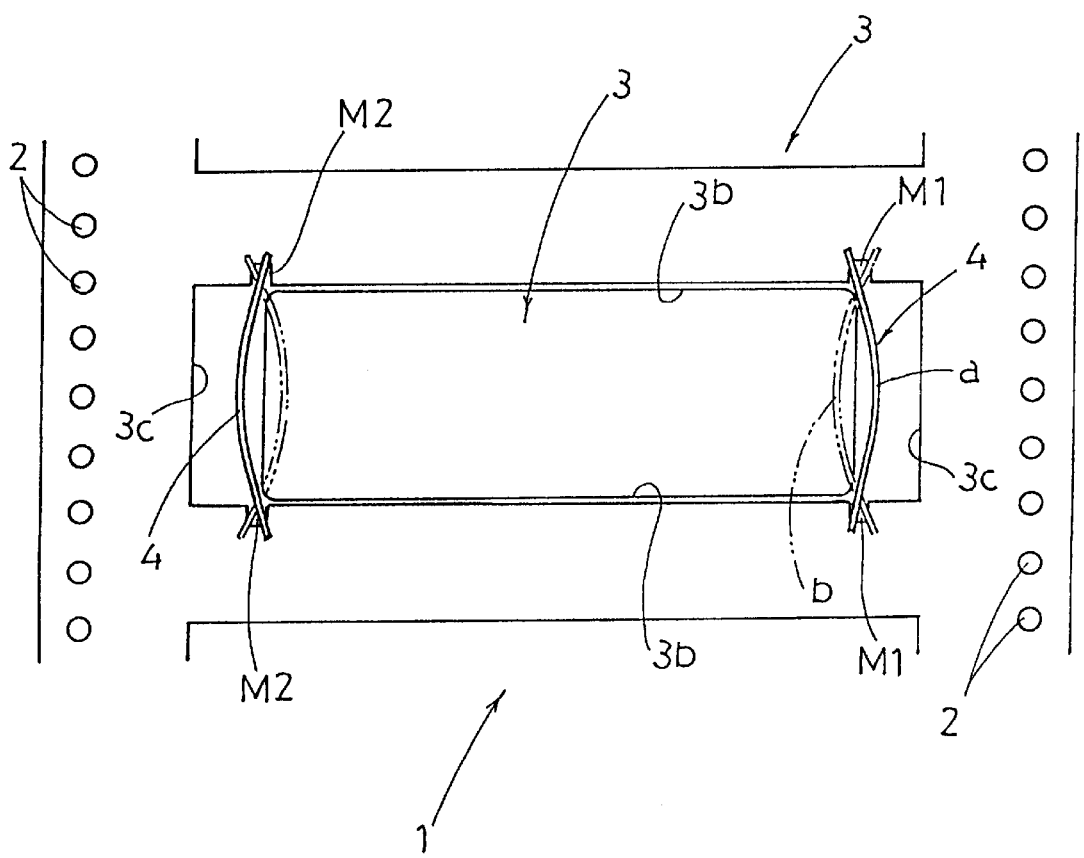
FIG. 4 is a plan view of the accommodating recess.

FIG. 1 is an enlarged perspective view of a carrier tape, FIG. 2 is an enlarged perspective view of an accommodating recess in FIG. 1, FIG. 3 is an enlarged perspective view of an essential portion in FIG. 2, and FIG. 4 is a plan view of the accommodating recess.

In the drawings, a carrier tape 1 is made of resin, and is formed into a band-like shape such that the carrier tape 1 can be wound around a reel or the like (not shown). Sending holes 2 are continuously formed in opposite ends of the carrier tape 1 in its widthwise direction. Accommodating recesses 3 are formed in a row along a longitudinal direction of the carrier tape 1 at a distance from one another between the two rows of the sending holes 2. Each of the accommodating recesses 3 is formed into a bottomed recess whose upper surface is opened, a pair of long sidewall surfaces 3b are formed on outer periphery of a bottom surface 3a, a pair of short sidewall surfaces 3c are formed at right angles with the long sidewall surfaces 3b, and the accommodating recess 3 is formed into a substantially rectangular shape by these long sidewall surfaces 3b and the short sidewall surfaces 3c. Therefore, a product such as an electronic part 5 and the like to be accommodated in each of the accommodating recesses 3 is formed into a rectangular shape corresponding to the accommodating recess 3. The electronic part 5 to be accommodated is a super LSI, a connector, a resistor or the like.

As shown in FIG. 2, the long sidewall surfaces 3b of each of the accommodating recesses 3 project outward to form fitting grooves M1 and M2. As shown in FIG. 3, each of the fitting grooves M1 and M2 is formed in a U-shaped projection 3d which is formed by integrally projecting a predetermined position of the long sidewall surface 3b outward into a U-shape. When the accommodating recess 3 is formed by a molding die, this U-shaped projection 3d is integrally formed and the fitting grooves M1 and M2 are integrally formed in predetermined positions.

As shown in FIG. 3, an engaging hole H1 is formed in a lower portion of the U-shaped projection 3d so as to pass through the latter outward.

An opening-closing spring piece 4 made of resin into a plate-like shape is fitted in each of the fitting grooves M1 and M2. The opening-closing spring piece 4 is formed at its opposite ends of a lower portion thereof with engaging projections 4a integrally projecting outward. As shown in FIG. 3, these engaging projections 4a can be inserted into engaging holes H1 such that the engaging projections 4a project outward. In such a fitting state, the opposite ends of the opening-closing spring piece 4 are fitted to the fitting grooves M1 and M2, and in this fitting state as shown in a plan view of FIG. 4, the opening-closing spring piece 4 is capable of opening and closing by its spring force from an opening position shown with a where the opening-closing spring piece 4 is curved toward the short sidewall surface 3c to a closing position shown with b where the opening-closing spring piece 4 is curved toward a center of the accommodating recess 3. The opening and closing operation from the position a to the position b is carried out by a jig (not shown).

The opening and closing operation from the position a to the position b can be carried out by inserting the jig from an upper surface side of the accommodating recess 3, or by forming a hole for the jig in the short sidewall surface 3c, and inserting the jig into the accommodating recess 3 from outside the short sidewall surface 3c so that the opening-closing spring piece 4 can be switched from the position a to the position b.

When the opening-closing spring piece 4 is in the opening position a, the electronic part 5 can be inserted and accommodated in the accommodating recess 3 from above, or the electronic part 5 accommodated in the accommodating recess 3 can be taken out upward by vacuum or the like, and the electronic part 5 can freely be inserted in and taken out from the accommodating recess 3.

Reversely, in a state where the electronic part 5 is accommodated in the accommodating recess 3, if the opening-closing spring piece 4 is operated to the closing position b shown with the phantom lines in FIG. 4, the opening-closing spring piece 4 is located on an upper surface of the accommodated electronic part 5 so that the upper surface thereof is covered with the opening-closing spring piece 4. Therefore, the electronic part 5 is prevented from dropping out from the accommodating recess 3 upward and thus, in this state, the electronic part 5 should not drop out from the accommodating recess 3.

The opening-closing spring piece 4 which is formed separately is simple in shape and thus, can easily be formed by die cutting using a press. This separately formed opening-closing spring piece 4 is mounted such that its opposite ends are fitted in the fitting grooves M1 and M2 formed in each of the accommodating recess 3 of the carrier tape 1, and the mounted opening-closing spring piece 4 is operated for open and closing by the jig (not shown). In the opening position, a product can easily be inserted in the accommodating recess and can easily be taken out, but in the closed position of the opening-closing spring piece 4, the product in the accommodating recess 3 is prevented from dropping out. It is possible to form the accommodating recess 3 having a simple shape, and to produce the carrier tape 1 at low cost. Further, a product such as the electronic part can easily be accommodated and can be prevented from dropping out.

What is claimed is:

1. A carrier tape for accommodating products comprising a plurality of recesses provided in a row, each recess being formed by pairs of opposing sidewalls, one pair of sidewalls having grooves near their ends, a closed bottom wall and open upper surface; a pair of opening-closing spring pieces, each spring piece being separately formed as a plate having opposite ends, each end being fitted into a groove;

said spring pieces operating to accommodate a product when in the open position, preventing the dropping out when in the closed position and permitting easy product removal when returned to the open position.

* * * * *